United States Patent [19]

Wang et al.

[11] Patent Number: 5,129,981

[45] Date of Patent: Jul. 14, 1992

[54] METHOD OF SELECTIVELY ETCHING SILICON

[75] Inventors: Su-Chee S. Wang, Sterling Heights, Mich.; Vincent M. McNeil, Somerville; Martin A. Schmidt, Reading, both of Mass.

[73] Assignees: General Motors Corporation, Detroit, Mich.; Massachusetts Institute of Technology, Cambridge, Mass.

[21] Appl. No.: 669,158

[22] Filed: Mar. 14, 1991

[51] Int. Cl.⁵ .................. H01L 21/306; B44C 1/22; C03C 15/00; C03C 25/06

[52] U.S. Cl. .................................. 156/628; 156/647; 156/653; 156/657; 156/659.1; 156/662; 204/129.65; 252/79.5

[58] Field of Search ............... 156/628, 647, 653, 657, 156/659.1, 662; 252/79.5; 204/129.1, 129.43, 129.65

[56] References Cited

PUBLICATIONS

J. A. Oakes, "A Pressure Sensor for Automotive Application", *Proceedings of Third International Conference on Automotive Electronics*, pp. 143-149, 20-23 Oct. 1981, London, England (published by Mechanical Engineering Publications of London, England).

K. D. Wise and S. K. Clark, "Diaphragm Formation and Pressure Sensitivity in Batch-Fabricated Silicon Pressure Sensors", *IEDM Technical Digest*, International Electron Devices Meeting, Washington, D.C., Dec. 4-6, 1978, pp. 96-98.

R. L. Smith, B. Kloeck, N. DeRooij and S. D. Collins, "The Potential Dependence of Silicon Anisotropic Etching in KOH at 60° C.", *J. Electroanal. Chem.*, vol. 238, pp. 103-113 (1987).

I. Barycka, H. Teterycz, and Z. Znamirowski, "Sodium Hydroxide Solution Shows Selective Etching of Boron-Doped Silicon", *J. Electrochem. Soc.*, vol. 126, pp. 345-346, Feb. 1979.

N. F. Raley, Y. Sugiyama, and T. VanDuzer, "(100) Silicon Etch-Rate Dependence on Boron Concentration in Ethylenediamine-Pyrocatechol-Water Solutions", *J. Electrochem. Soc.*, vol. 131, pp. 161-171, Jan. 1984.

E. D. Palik, V. M. Bermudez, and O. J. Glembocki, "Ellipsometric Study of the Etch-Stop Mechanism in Heavily Doped Silicon", *J. Electrochem. Soc.*, vol. 132, pp. 135-141, Jan. 1985.

H. Seidel, "The Mechanism of Anisotropic, Electrochemical Silicon Etching in Alkaline Solutions", IEEE Solid-State Sensor and Actuator Workshop, Hilton Head Island, pp. 86-91, 1990.

H. A. Waggener, "Electrochemically Controlled Thinning of Silicon", *The Bell System Technical Journal*, pp. 473-475, Mar. 1970.

H. A. Waggener and J. V. Dalton, "Control of Silicon Etch Rates in Hot Alkaline Solutions by Externally Applied Potentials", *Electrochem. Soc. Ext. Abstr.* No. 237, pp. 587-589, Fall Meeting, 1972.

(List continued on next page.)

*Primary Examiner*—William A. Powell
*Attorney, Agent, or Firm*—Robert J. Wallace

[57] ABSTRACT

The present invention relates to a method of forming thin bodies of a semiconductor material, such as single crystalline silicon, by selectively etching away a portion of the body until a body of the desired thickness is obtained. The body includes a p-n junction made up of adjacent regions of p-type and n-type conductivity which are immersed in a chemical etchant with the surface of the p-type region being exposed to the etchant. A time varying voltage waveform having first and second voltage levels is applied through the etchant to the p-n junction. The first voltage level causes a zero forward bias across the p-n junction and the second voltage level causes a reverse bias across the p-n junction. The p-type region is removed by the chemical etchant down to the n-type region. This essentially removes the p-n junction in the area where the p-type region is etched away and resulting current through the n-type region causes a passivating layer to form on the surface of the n-type region which stops further etching.

31 Claims, 1 Drawing Sheet

PUBLICATIONS

T. N. Jackson, M. A. Tischler, and K. D. Wise, "An Electrochemical P-N Junction Etch-Stop for the Formation of Silicon Microstructures", *IEE Electron Device Letters*, vol. EDL-2, No. 2, pp. 44–45, Feb. 1981.

S. C. Kim and K. D. Wise, "Temperature Sensitivity in Silicon Piezoresistive Pressure Transducers", *IEEE Transactions on Electron Devices*, vol. ED-30, No. 7, pp. 802–810, Jul. 1983.

P. M. Sarro and A. W. vanHerwaarden, "Silicon Cantilever Beams Fabricated by Electrochemically Controlled Etching for Sensor Applications", *J. Electrochem. Soc.*, vol. 133, pp. 1724–1729, Aug. 1986.

M. Hirata, S. Suwazono, and H. Tanigawa, "Diaphragm Thickness Control in Silicon Pressure Sensors Using an Anodic Oxidation Etch-Stop", *J. Electrochem. Soc.*, vol. 134, No. 8, pp. 2037–2041, Aug. 1987.

B. Kloeck, S. D. Collins, N. F. DeRooij, and R. L. Smith, "Study of Electrochemical Etch-Stop for High-Precision Thickness Control of Silicon Membranes", *IEEE Transactions on Electron Devices*, vol. 36, No. 4, pp. 663–669, Apr. 1989.

Y. Linden, L. Tenerz, J. Tiren and B. Hok, "Fabrication of Three-Dimensional Silicon Structures by Means of Doping-Selective Etching (DSE)", *Sensors and Actuators*, 16, pp. 67–82, 1989.

Y. P. Xu and R. S. Huang, "Anodic Dissolution and Passivation of Silicon in Hydrazine", *J. Electrochem. Soc.*, vol. 137, No. 3, pp. 948–953, Mar. 1990.

V. M. McNeil, S. S. Wang, K-Y Ng, and M. A. Schmidt, "An Investigation of the Electrochemical Etching of (100) Silicon in CsOH and KOH", IEEE Solid-State Sensor and Actuator Workshop, Hilton Head Island, pp. 92–97, 1990.

E. D. Palik, J. W. Faust, Jr., H. F. Gray, and R. F. Greene, "Study of the Etch-Stop Mechanism in Silicon", *J. Electrochem. Soc.*, vol. 129, No. 9, pp. 2051–2059, 1982.

J. W. Faust, Jr. and E. D. Palik, "Study of the Orientation Dependent Etching and Initial Anodization of Si in Aqueous KOH", *J. Electrochem. Soc.*, vol. 130, pp. 1413–1420, Jun. 1983.

O. J. Glembocki, R. E. Stahlbush, and M. Tomkiewicz, "Bias-Dependent Etching of Silicon in Aqueous KOH", *J. Electrochem. Soc.*, vol. 132, No. 1, pp. 145–151, Jan. 1985.

R. L. Smith, B. Kloeck, N. F. DeRooij, and S. D. Collins, "The Potential Dependence of Silicon Anisotropic Etching in KOH at 60° C.", *J. Electroanalytical Chem. and Interfacial Electrochem.*, 238, pp. 103–113, 1987.

L. D. Clark, Jr., J. L. Lund, and D. J. Edell, "Cesium Hydroxide (CsOH): A Usual Etchant for Micromachining Silicon", IEEE Solid-State Sensor and Actuator Workshop, Hilton Head Island, Jun. 1988.

L. D. Clark, Jr. and D. J. Edell, "KOH:$H_2O$ Etching of (110) Si, (111) Si, $SiO_2$, and Ta: An Experimental Study", IEEE Microrobots and Teleoperators Workshop, Hyannis, Mass., Nov. 1987.

METHOD OF SELECTIVELY ETCHING SILICON

FIELD OF THE INVENTION

The present invention relates to a method of selectively electrochemically etching silicon and, more particularly, to a method of electrochemically etching a silicon body which has an automatic stop to control the thickness to which the body is etched.

BACKGROUND OF THE INVENTION

In the electronic field there are a number of uses for very thin bodies of single crystalline silicon. For example, in the article of J. A. Oakes entitled, "A Pressure Sensor for Automotive Application," published in the *Proceedings of Third International Conference on Automotive Electronics*, October, 1981, pages 143-149, there is described a pressure sensor formed of single crystalline silicon and having a thin diaphragm region. In order to form the thin silicon bodies, such as the thin diaphragm region of the pressure sensor of J. A. Oakes, it has been the practice to etch a thicker silicon body down to the desired thickness.

Heretofore, an anisotropic etching technique has been used to form the bodies of silicon since such etching technique selectively etches more slowly along certain crystallographic planes, such as the <111> plane, than along other planes, such as the <100> and <110> planes, in etchants with sufficiently high pH values. Typical etchants include KOH, NaOH, LiOH, CsOH, $NH_4OH$, ethylenediamine pyrocatechol, and hydrazine. In addition to the crystal orientation selectivity of these etchants, a sufficiently high constant positive bias applied between a silicon body and an electrode both immersed in the etchant results in a current flow which causes the formation of a silicon dioxide layer on the surface of the body. The silicon dioxide layer resists etching and thus effectively prevents etching of the silicon body. This phenomena is referred to as "electrochemical etch stop." The bias required to passivate the surface of the silicon body is denoted as the "passivating potential (voltage)."

The electrochemical etch stop has been utilized in forming the bodies of silicon by starting with a body having a region of n-type conductivity adjacent a region of p-type conductivity which form a p-n junction. The n-type region is formed of the thickness desired for the thin body. The starting body is placed in the chemical etchant with the surface of the p-type region being exposed for etching, and a constant voltage is applied between the n-type conductivity region of the starting body and an electrode in the chemical etchant which is spaced from the starting body. This constant voltage reverse biases the p-n junction so that ideally no current flows into the p-type and n-type regions. The p-type region is anisotropically etched away by the chemical etchant until it is completely removed. After the p-type region is completely removed (etched away), the n-type region is exposed to the etchant. The n-type region now acts as a relatively low resistance resistor with a voltage thereacross which gives rise to a current therethrough. This current flow through the n-type region, which is at a voltage which facilitates the formation of a passivation layer (e.g., silicon dioxide), causes a passivation layer of silicon dioxide to be formed over the surface of the n-type region which stops the chemical etching. This leaves a thin silicon body of the desired thickness.

A problem with this type of electrochemical etching is that some reversed biased p-n junctions are much more leaky (i.e., they conduct current therethrough in the reverse direction) than others. This leakage is the result of the reverse resistance of the p-n junction which varies considerably from lot to lot. As a result, the voltage on the surface of the p-type region varies from lot to lot of p-n junctions. With current flow through the p-n junction and a sufficiently positive voltage on the etching surface of the p-type region, a passivation layer can form over the etching p-type region which cuts off further etching and therefore prevents the desired thickness of the semiconductor wafer from being achieved.

It is desirable to have an electrochemical etching technique for use with p-n junctions which is relatively insensitive to variations in reverse bias leakage through the p-n junctions.

SUMMARY OF THE INVENTION

The present invention comprises a method of selectively electrochemically etching a body of semiconductor material in which a time varying voltage having first and second voltage levels is applied across the body while it is subjected to the chemical etch. This selectively removes a portion of the body of p-type conductivity type while stopping when a region of n-type conductivity type is reached.

Viewed from one aspect, the present invention is directed to a method of removing portions of a p-type conductivity semiconductor layer of a p-n junction comprising an n-type semiconductor layer with a p-type layer adjacent thereto. The method comprises the steps of placing the p-n junction in a chemical etchant, and applying a time varying voltage waveform across the p-n junction which varies in voltage level from a first level that provides an essentially zero forward bias across the p-n junction to a second level which provides a reverse bias voltage across the p-n junction so as to etch away a portion of the p-type layer.

Viewed from another aspect, the present invention is directed to a method of removing portions of a p-type conductivity semiconductor layer of a p-n junction comprising an n-type semiconductor layer with a p-type layer adjacent thereto. The method comprises the steps of placing the p-n junction in a chemical etchant, and applying a time varying voltage waveform across the p-n junction which varies in voltage level from a first level which is less than a potential required to passivate both the n-type and p-type layer to a second level which is greater than a potential required to passivate the n-type layer.

The invention will be better understood from the following more detailed description taken with the accompanying drawings and claims.

DETAILED DESCRIPTION

Figure 1:
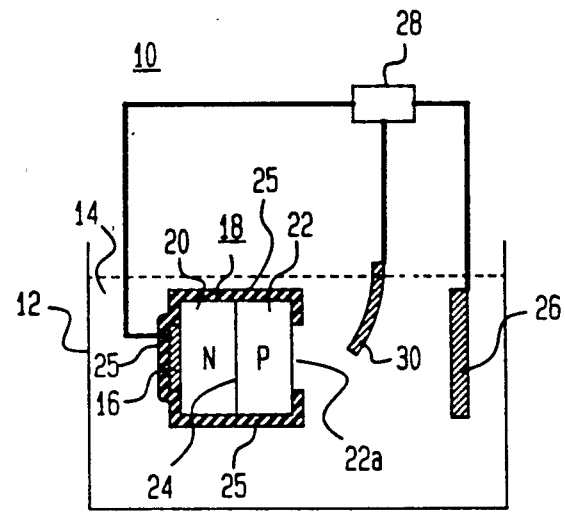
FIG. 1 is a schematic view of an apparatus which can be used to carry out the method of the present invention.

Referring to FIG. 1, there is shown an electrochemical etching apparatus 10 which is useful for etching silicon and which can be used to carry out the method of the present invention. Apparatus 10 comprises a container 12 which contains a liquid chemical etchant 14. A wafer support electrode 16 is in the container 12 and has a wafer 18 of a semiconductor material, such as silicon, to be etched thereon. The wafer 18 has thereacross a region 20 of n-type conductivity and an adjacent region 22 of p-type conductivity which form a p-n junction 24. Electrode 16 makes physical and electrical contact to region 20 but is isolated from the etchant 14 by a masking layer 25. The n-type region 20 is of a thickness equal to desired thickness of the body to be formed. The wafer 18 is mounted on the electrode 16 with the n-type region 20 seated against the electrode 16 and the p-type region 22 being exposed along a surface 22a thereof to the chemical etchant 14. If only a portion of the p-type region 22 is to be removed, the masking layer 25 is coated over the periphery of the wafer 18 except for a portion of the surface 22a of the p-type region 22.

A counter electrode 26 is within the chemical etchant 14 and is spaced from the wafer 18. The counter electrode 26 and the support electrode 16 are electrically connected to a potentiostat 28. A reference electrode 30 is within the chemical etchant 14 between the counter electrode 26 and the wafer 18. The reference electrode 30 is also electrically connected to the potentiostat 28 so as to permit adjustment of the voltage between the support electrode 16 and the electrode 26. The voltage between electrodes 16 and 26 is adjusted to reach a desired voltage between electrodes 16 and 30.

In a prior art operation of apparatus 10, a fixed bias (voltage) is applied between electrodes 16 and 26 so as to reverse bias p-n junction 24. Ideally, there is little current flow through the p-n junction 24 and thus surface 22a does not have a passivation layer formed thereon. Under these conditions, the surface portion 22a of the p-type layer 22 etches away until a surface of the n-type region 20 is exposed to the chemical etchant 14. As soon as a surface of n-type region 20 becomes exposed to the chemical etchant 14, the p-n junction 24 is eliminated and current begins to flow from electrode 16, through the n-type region 20, and into the chemical etchant 14. If there is current flow through the n-type region 20 into the chemical etchant 14 and the voltage of exposed surface of region 20 is greater than the passivation potential of n-type silicon, then a protective silicon dioxide layer forms on the exposed surface of region 20. This silicon dioxide layer prevents further etching of region 20 since it is resistant to etching. One serious problem with this prior art method of operation of the apparatus 10 of FIG. 1 is the existence of reverse bias leakage through the p-n junction. This reverse bias leakage is difficult to predict and is indicative of the reverse bias resistance of the p-n junction being lower in some cases than is desired. As a result of the decreased reverse bias resistance, the voltage drop across the p-n junction decreases and thereby results in the voltage at the surface 22a becoming more positive than the passivation potential of p-type silicon. This results in a passivating silicon dioxide layer being formed on surface 22a which prevents further etching and thus does not allow the desired end result which is the complete removal of a portion of region 22 so as to expose a surface of region 20.

The method of the present invention comprises placing in a liquid chemical etchant a body of a semiconductor material, such as single crystalline silicon, having adjacent regions of opposite conductivity type, i.e., n-type conductivity and p-type conductivity, forming a p-n junction therebetween. The body is positioned with the p-type region exposed to the chemical etchant. A time varying waveform (bias) is applied between the body and an electrode which is in the chemical etchant and is spaced from the body. The waveform is varied between two voltage levels, such as, for example, $-1.6$ volts and 0 volts using a Ag/AgCl electrode 30. The voltage can be scanned between the two values at any rate at which the p-type region etches and the n-type region does not etch. This rate can vary from 0.1 mV/sec. to 100 V/sec. At different scan rates, the selectivity of etching between the p-type region and the n-type region may vary. The voltage may be scanned along different waveforms, such as triangular, sinusoidal or pulsed. The particular etchant, its concentration and temperature may vary, as long as the etchant effectively etches the semiconductor material. For silicon etchants such as KOH, NaOH, LiOH, CsOH, NH$_4$OH, ethylenediamine pyrocatechol and hydrazine at concentrations of 5 to 95% and at a temperature of between 10° C. and 120° C. may be used satisfactorily.

Figure 2:
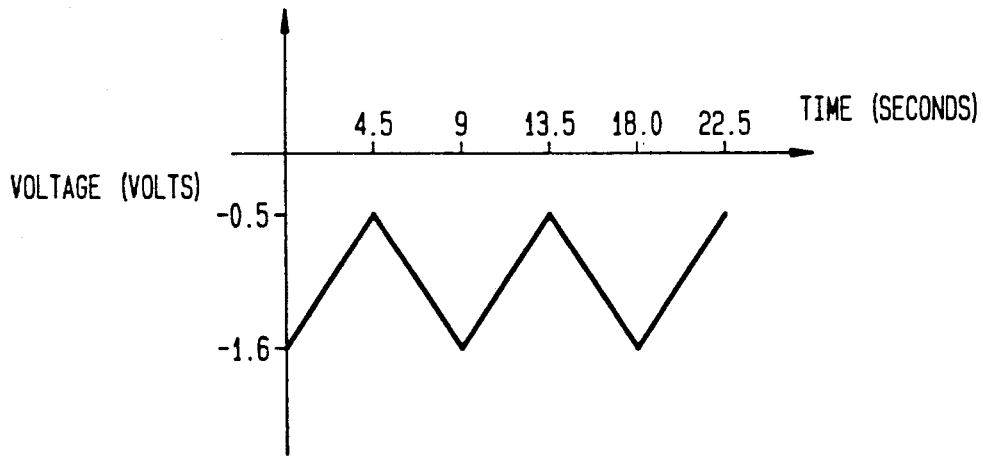
FIG. 2 shows a voltage waveform which is applied to the apparatus of FIG. 1 in accordance with the method of the present invention.

In the operation of the etching apparatus 10 of FIG. 1 in accordance with the method of the present invention, the exposed area of the p-type region 22 of the wafer 18 is etched by the chemical etchant 14. FIG. 2 graphically shows a voltage versus time illustrative waveform which is applied to the electrode 16 by the potentiostat 28 referenced to the electrode 26. The voltage levels of the waveform are $-0.5$ volts and $-1.6$ volts referenced to the electrode 30 when same is a Ag/AgCl electrode. The $-1.6$ volt level results in the p-n junction 24 having a zero forward bias thereacross and there being essentially no current flow therethrough. The $-0.5$ volt level results in the p-n junction 24 being reverse biased by about 0.9 volts. As such, p-n junction 24 can have leakage current flow therethrough from region 20 to region 22. The voltage levels of the waveform applied to electrode 16 can be $-1.6$ volts and 0 volts.

Figure 3:
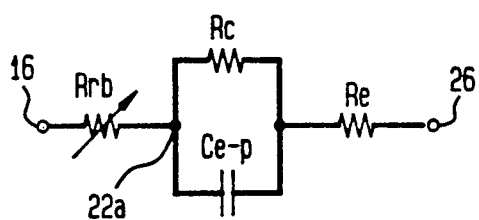
FIG. 3 is an electrical equivalent of the apparatus of FIG. 1 when the method of the present invention is utilized.

Referring now to FIG. 3, there is shown an approximate equivalent electrical circuit of the apparatus 10 of FIG. 1 when it has the voltage waveform of FIG. 2 applied to electrode 16 and 0 volts applied to electrode 26. The equivalent circuit comprises the reverse bias resistance Rrb of the p-n junction 24 in series with the parallel combination of the contact resistance Rc of surface 22a with the etchant 14 and the capacitance Ce-p between the surface 22a of p-type layer 22 and the etchant 14 which are in series with the resistance Re of the etchant 14. The arrow through Rrb indicates that the resistance through a reversed biased p-n junction varies considerably from lot to lot of p-n junctions. It is to be noted that there is a capacitance of the reverse biased p-n junction in parallel with Rrb which is not shown since same is typically of negligible value in this application.

In the prior art method discussed hereinabove, Ce-p plays essentially no role in the operation since a fixed DC voltage is applied between electrodes 16 and 26. Typically, Rrb and Rc are of relatively high value resistances and Re is a relatively low value resistance. Accordingly, variations in Rrb can easily cause an undesirably large change in the voltage of surface 22a when current flows through the p-n junction 24 in the reverse direction. This current flow, when coupled with region 20 being at a voltage which is greater than the passivation potential of p-type silicon, can result in the forming of a passivating layer on p-type layer 22 which then prevents further etching therethrough.

The impedance of Ce-p is a function of the type, temperature and concentration of the etchant used and is proportional to the inverse of the frequency of the waveform applied to electrodes 16 and 26. Accordingly, proper selection of the etchant 14 and the frequency of the applied waveform controls the impedance of Ce-p. Since Ce-p is in parallel with Rc, the impedance of the parallel combination is controlled by the element with the lower impedance. Thus, if the impedance of Ce-p is low, then the parallel combination of Ce-p and Rc is even lower. The low impedance of this parallel combination is in series with the relatively low impedance of Re and thus the equivalent impedance is relatively low compared to the impedance of Rrb. Accordingly, the voltage of surface 22a closely follows that of electrode 26 even with variations in the value of Rrb. It is thus easier to maintain the voltage of surface 22a at a level more negative than the passivation potential of p-type silicon using the method of the present invention as compared to the prior art method and thus to increase yield and thereof lower the cost of manufacture.

Applicants' recognition of Ce-p, and the use of an AC biasing waveform so as to utilize Ce-p, allows etching completely through layer 22 before a passivating layer is formed and thus increases yield and reduces cost of manufacture.

Figure 4:
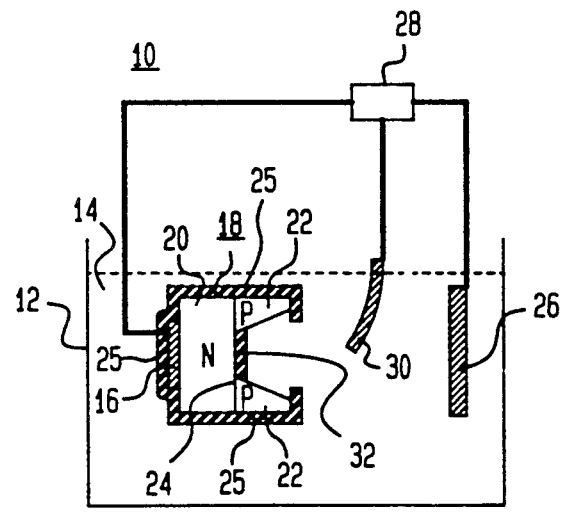
FIG. 4 is a schematic view similar to FIG. 1 showing the semiconductor body after it has been etched.

Referring now to FIG. 4, there is shown the apparatus 10 after the p-type region 22 has been completely etched through using the method of the present invention. When the voltage across electrodes 16 and 26 is greater than the passivation potential of n-type silicon, a current flows through the n-type region 20 and these conditions result in the formation of a passivating layer (e.g., silicon dioxide) 32 on the surface of the n-type region 20. The voltage on electrodes 16 and 26 now result in a current through the n-type region 20 which forms a passivating layer (e.g., silicon dioxide) 32 of silicon dioxide on the surface of the n-type region 20. This stops the etching to leave a portion of the wafer 18 of the desired thickness. The frequency of the voltage waveform of FIG. 2 has to be great enough so that there is insufficient time at or near the lower voltage level for the passivating layer 32 to completely etch away and expose the silicon therebelow to the etchant. A wafer 18 with a central portion of a p-type layer 22 removed therefrom can serve as a basic portion of a pressure sensor with the exposed portion of the n-type region acting as a diaphragm.

We placed a wafer of single crystalline silicon of p-type conductivity on a support electrode 16 in a chemical etchant 14 of a 50% aqueous solution of CsOH at a temperature of 60° C. A platinum counter electrode 26 and a Ag/AgCl reference electrode 30 were immersed in the chemical etchant. A bias voltage was applied between the support electrode and the counter electrode and, using the potentiostat 28, the voltage was varied to provide a scanning along a triangular waveform of between −1.6 volts and −0.05 volts as measured between the support electrode and the reference electrode. The potentiostat 28 used is an EG&G model number 273. The scan rate was 20 mV/sec. and was controlled by the potentiostat. Under continuous scanning, the p-type wafer did not passivate in the 50% solution of CsOH and etched at a rate of 11 micrometers per hour. This etch rate is identical to that measured in 50% CsOH at 60° C. without an applied voltage. However, an n-type wafer treated under the same conditions was passivated under continuous scanning and its etch rate was negligible. Therefore, when a substrate having contiguous p-type and n-type regions is subjected to the chemical etch with the continuous scanning of the voltage, the p-type layer should be completely removed and the etching should stop at the n-type region when the passivating layer is formed.

The structure of the partially etched away silicon wafer 18 shown in FIG. 4 is obtainable using an other method invented by the same inventors which is disclosed and claimed in a co-pending U.S. patent application Ser. No. 07/670,119, now abandoned, entitled, "Selective Electrochemical Etching," and filed concurrently with the present application and having a common assignee.

It is to be appreciated and understood that the specific embodiments of the invention are merely illustrative of the general principles of the invention. Various modifications may be made consistent with the principles set forth. For example, instead of a body of silicon, the semiconductor body may be any other semiconductor material which can be chemically etched and which will selectively form a passivating layer when a current is passed therethrough.

The embodiments of the invention in which an exclusive property or privilege is claimed are defined as follows:

1. A method of removing portions of a p-type conductivity semiconductor layer of a p-n junction comprising an n-type semiconductor layer with the p-type layer adjacent thereto comprising the steps of:
   placing the p-n junction in a chemical etchant; and
   applying a time varying voltage waveform across the p-n junction which varies in voltage level from a first level that provides an essentially zero forward bias across the p-n junction to a second level which provides a reverse bias voltage across the p-n junction so as to etch away a portion of the p-type layer.

2. The method of claim 1 further comprising the step of covering the n-type layer and portions of the p-type layer which are not to be removed with a protective covering which limits the etchant from removing same.

3. The method of claim 2 further comprising the step of coupling a first electrode to the n-type layer and inserting a second electrode in the etchant such that the second electrode is separated from the p-type layer by the etchant.

4. The method of claim 3 further comprising the step of continuing to apply the varying voltage waveform across the p-n junction until a portion of p-type layer is completely etched away down to a portion of the n-type layer and a passivating layer is then formed on the exposed portion of the n-type layer.

5. The method of claim 4 in which the applied voltage varies between levels in the range of about 0 volts to about −1.6 volts with same being applied to the first electrode while the second electrode is held at 0 volts.

6. The method of claim 5 in which the applied voltage is varied at a rate of 0.1 to 100 V/sec.

7. The method of claim 6 in which the n-type layer is of single crystalline silicon.

8. The method of claim 7 in which the chemical etchant is an aqueous solution of an etchant selected from the group consisting of KOH, NaOH, LiOH, CsOH, NH₄OH, ethylenediamine pyrocatechol and hydrazine.

9. The method of claim 8 in which the etchant is a 5 to 95% aqueous solution and is at a temperature of between 10° C. and 120° C.

10. The method of claim 1 in which the applied voltage is a triangular waveform.

11. The method of claim 1 in which the applied voltage is a sinusoidal waveform.

12. A method of chemically etching away portions of a p-type conductivity silicon layer of a p-n junction comprising an n-type semiconductor body with the p-type layer being adjacent thereto comprising the steps of:
coupling a first electrode to the n-type body;
placing the p-n junction in a liquid chemical etchant;
inserting a second electrode into the liquid chemical etchant such that the second electrode is separated from the p-type layer by the liquid chemical etchant; and
applying a time varying voltage waveform across electrodes such that the p-n junction which varies in voltage level from a first level that provides an essentially zero forward bias across the p-n junction to a second level which provides a reverse bias voltage across the p-n junction so as to etch away a portion of the p-type layer.

13. The method of claim 12 further comprising the step of covering the n-type semiconductor body and portions of the type layer which are not to be removed with a protective covering which limits the etchant from removing same.

14. The method of claim 13 further comprising the step of continuing to apply the varying voltage waveform across the p-n junction until a portion of p-type layer is completely etched away down to a portion of the n-type semiconductor body and a passivating layer is then formed on the exposed portion of the n-type semiconductor body.

15. The method of claim 14 in which the applied voltage varies between levels in the range of about 0 volts to about −1.6 volts with same being applied to the first electrode while the second electrode is held at 0 volts.

16. The method of claim 15 in which the applied voltage is varied at a rate of 0.1 to 100 V/sec.

17. The method of claim 16 in which the n-type semiconductor body is of single crystalline silicon.

18. The method of claim 17 in which the chemical etchant is an aqueous solution of an etchant selected from the group consisting of KOH, NaOH, LiOH, CsOH, NH₄OH, ethylenediamine pyrocatechol and hydrazine.

19. The method of claim 18 in which the etchant is a 5 to 95% aqueous solution and is at a temperature of between 10° C. and 120° C.

20. The method of claim 12 in which the applied voltage is a triangular waveform.

21. The method of claim 12 in which the applied voltage is a sinusoidal waveform.

22. A method of forming a semiconductor diaphragm from an n-type conductivity semiconductor wafer with a p-type conductivity layer covering a surface thereof by chemically etching away portions of the p-type layer to expose a portion of the n-type wafer therebelow comprising the steps of:
coupling a first electrode to the n-type semiconductor wafer;
placing the wafer with the p-type layer thereon in a liquid chemical etchant;
inserting a second electrode into the liquid chemical etchant such that the second electrode is separated from the p-type layer by the liquid chemical etchant;
applying a time varying voltage waveform across electrodes such that the resulting voltage across a p-n junction comprising the n-type wafer and the p-type layer varies in voltage level from a first level that provides an essentially zero forward bias across the p-n junction to a second level which provides a reverse bias voltage across the p-n junction so as to etch away a portion of the p-type layer; and
continuing to apply the varying voltage waveform across the p-n junction until a portion of p-type layer is completely etched away down to a portion of the n-type wafer and a passivating layer is then formed on the exposed surface portion of the n-type wafer.

23. The method of claim 22 further comprising the step of covering the n-type wafer and portions of the type layer which are not to be removed with a protective covering which limits the etchant from removing same.

24. The method of claim 23 in which the applied voltage varies between levels in the range of about 0 volts to about −1.6 volts with same being applied to the first electrode while the second electrode is held at 0 volts.

25. The method of claim 24 in which the applied voltage is varied at a rate of 0.1 to 100 V/sec.

26. The method of claim 25 in which the n-type wafer is of single crystalline silicon.

27. The method of claim 26 in which the chemical etchant is an aqueous solution of an etchant selected from the group consisting of KOH, NaOH, LiOH, CsOH, NH₄OH, ethylenediamine pyrocatechol and hydrazine.

28. The method of claim 27 in which the etchant is a 5 to 95% aqueous solution and is at a temperature of between 10° C. and 100° C.

29. The method of claim 22 in which the applied voltage is a triangular waveform.

30. The method of claim 22 in which the applied voltage is a sinusoidal waveform.

31. A method of removing portions of a p-type conductivity semiconductor layer of a p-n junction comprising an n-type semiconductor layer with the p-type layer adjacent thereto comprising the steps of:
placing the p-n junction in a chemical etchant; and
applying a time varying voltage waveform across the p-n junction which varies in voltage level from a first level which is less than a potential required to passivate both the p-type and n-type layers to a second level which is greater than a potential required to passivate the n-type layer.

* * * * *